(12) United States Patent
Shiraishi

(10) Patent No.: US 8,159,595 B2
(45) Date of Patent: Apr. 17, 2012

(54) CAMERA MODULE HAVING CIRCUIT COMPONENT

(75) Inventor: Satoshi Shiraishi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 170 days.

(21) Appl. No.: 12/706,232

(22) Filed: Feb. 16, 2010

(65) Prior Publication Data

US 2010/0208132 A1    Aug. 19, 2010

(30) Foreign Application Priority Data

Feb. 17, 2009   (JP) ................................. 2009-033927

(51) Int. Cl.
*H04N 5/225* (2006.01)
(52) U.S. Cl. ......................... 348/340; 348/373; 348/374
(58) Field of Classification Search .................. 348/335, 348/340, 373–375
See application file for complete search history.

(56) References Cited

U.S. PATENT DOCUMENTS

| | | | | |
|---|---|---|---|---|
| 7,005,310 B2* | 2/2006 | Hanada et al. | .................. | 438/25 |
| 8,045,026 B2* | 10/2011 | Abe | .............................. | 348/294 |
| 2004/0095501 A1* | 5/2004 | Aizawa et al. | ................. | 348/340 |
| 2005/0110889 A1* | 5/2005 | Tuttle et al. | .................... | 348/340 |
| 2005/0174469 A1* | 8/2005 | Cho et al. | ....................... | 348/340 |
| 2006/0181633 A1* | 8/2006 | Seo | ................................ | 348/340 |
| 2009/0128681 A1* | 5/2009 | Kim | .............................. | 348/335 |
| 2009/0262226 A1* | 10/2009 | Lee et al. | ...................... | 348/294 |
| 2010/0149410 A1* | 6/2010 | Matsuzawa | ................... | 348/374 |

FOREIGN PATENT DOCUMENTS

| | | |
|---|---|---|
| JP | 2005-6279 | 1/2005 |
| JP | 2006-339950 | 12/2006 |
| JP | 2007-181212 | 7/2007 |

* cited by examiner

*Primary Examiner* — Sinh Tran
*Assistant Examiner* — Selam Gebriel
(74) *Attorney, Agent, or Firm* — Drinker Biddle & Reath LLP

(57) ABSTRACT

A camera module includes: a case including a first surface formed with a first opening for entering incident light, and a second surface opposite to the first surface, the second surface being formed with a second opening; a lens unit mounted in the case; a first substrate including a front surface and a back surface, wherein the case is bonded to the front surface of the first substrate to seal the second opening; a filter supported by the first substrate to face the lens unit; a circuit component disposed on the front surface of the first substrate; a second substrate including a front face and a back face, wherein the front face of the second substrate is bonded to the back surface of the first substrate; and an image pickup device disposed on the front face of the second substrate to face the filer.

6 Claims, 6 Drawing Sheets

CAMERA MODULE HAVING CIRCUIT COMPONENT

This application claims priority from Japanese Patent Application No. 2009-033927, filed on Feb. 17, 2009, the entire contents of which are herein incorporated by reference.

BACKGROUND OF THE INVENTION

1. Technical Field

The present disclosure relates to a camera module used as an image pickup device.

2. Related Art

In portable terminals, there are various products equipped with image pickup devices. The image pickup devices of the portable terminals employ small size camera modules. In the camera module, a lens unit, an image pickup device, and circuit components such as a chip capacitor constituting a control circuit are mounted in a package.

As decrease in size has been required for portable terminals, decrease in size and thickness has also been required for camera modules mounted in the portable terminals. For this reason, various methods of manufacturing a camera module have been proposed. For example, instead of a method of arranging the circuit components on a substrate in parallel (i.e., not stacked), there is a method of stacking the circuit components on an image pickup device, a method of embedding the circuit components in a substrate on which the image pickup device is mounted, or a method of forming a cavity in a substrate and mounting the image pickup device in the cavity (see e.g., JP-A-2005-6279 and JP-A-2007-181212).

In order to decrease the size of the camera module, the height of the camera module may be decreased. In this case, the space between the lens and the image pickup device is decreased. However, in order to achieve high image quality (an increase in the number of pixels), it is necessary to increase the distance between the lens and the sensor surface of the image pickup device. This configuration is advantageous in light of a lens design, and enables high performance.

However, in the related-art camera module, for example, there is a method of embedding the circuit components in the substrate on which the image pickup device is mounted. In this method, it is possible to reduce a planar area of the camera module, but the thickness of the substrate is increased. Hence, in a case where the separation distance between the image pickup device and the lens is maintained, the decrease in the height of the camera module is limited as a whole.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

Accordingly, it is an illustrative aspect to provide a camera module capable of achieving a decrease in size and thickness without deteriorating the performance of the camera module.

According to one or more illustrative aspects of the present invention, there is provided a camera module. The camera module comprises: a case comprising: a first surface formed with a first opening for entering incident light; and a second surface opposite to the first surface, the second surface being formed with a second opening; a lens unit comprising a plurality of lenses and being mounted in the case; a first substrate comprising a front surface and a back surface opposite to the front surface, the first substrate comprising a first wiring, wherein the case is bonded to the front surface of the first substrate to seal the second opening of the case, a filter supported by the first substrate to face the lens unit; a circuit component disposed on the front surface of the first substrate to be electrically connected to the first wiring; a second substrate comprising a front face and a back face opposite to the front face, the second substrate comprising a second wiring, wherein the front face of the second substrate is bonded to the back surface of the first substrate such that the second wiring is electrically connected to the first wiring; and an image pickup device disposed on the front face of the second substrate to face the filer, the image pickup device being electrically connected to the second wiring.

According to the present invention, there is provided a camera module capable of maintaining high performance in image quality while effectively achieving a decrease in size and height of the device.

Other aspects and advantages of the present invention will be apparent from the following description, the drawings and the claims.

DETAILED DESCRIPTION OF EXEMPLARY EMBODIMENTS (Camera Module)

Hereinafter, a camera module according to exemplary embodiments of the invention will be now described with reference to the accompanying drawings.

Figure 1:
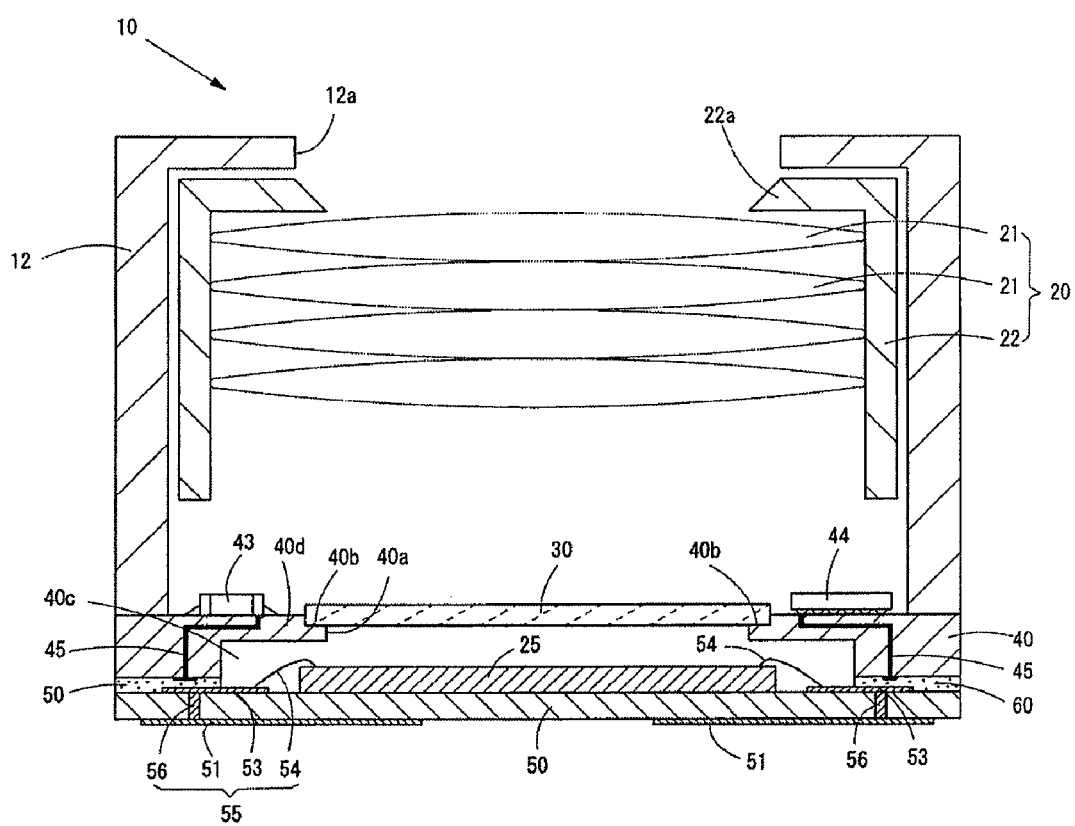
FIG. 1 is a sectional view illustrating a camera module according to an exemplary embodiment of the present invention.

FIG. 1 is a sectional view of the camera module. As shown in FIG. 1, the camera module 10 includes a case 12 that supports a lens unit 20, an image pickup device 25 that is disposed to face the lens unit 20, and an infrared-ray cut filter 30 that is disposed between the image pickup device 25 and the lens unit 20.

The lens unit 20 is an autofocus lens unit. The lens unit 20 includes a plurality of lens 21, a support barrel 22 that supports the lenses 21, and a driving mechanism (not shown) that adjusts a position of the lenses 21 to a focal position by minutely moving the support barrel 22 in an axial direction of the case 12. In the driving mechanism, a piezoelectric element or an electric motor may be used as a driving source. In addition, an autofocus mechanism of the camera module uses various mechanisms. Furthermore, instead of the autofocus mechanism, the embodiment of the invention is applicable to a fixed-focus camera module.

The case 12 is formed in a parallelepiped shape, in which an opening 12a for light-incidence is formed on the one end side thereof and the other end side is opened (in other words, an opening larger than the opening 12a is formed). The opening 12a is formed such that the center thereof coincides with the optical axis of the lenses 21. A blade portion 22a for protecting the lenses 21 is provided on the top (the upper edge portion) of the support barrel 22 such that the inner periphery of the blade portion 22a coincides with the inner periphery of the opening 12a.

To the end face on the other end side of the case 12 (opposite to the side on which the opening 12a is formed), a first substrate 40 for supporting a filter 30 and circuit components 43 and 44 is bonded. The first substrate 40 is formed in a rectangular planar shape, which is almost the same as the planar shape of the case 12. The first substrate 40 is aligned to the end face of the case 12 so as to completely seal the opening on the other end side of the case 12. To a back surface of the first substrate 40 opposite to a front surface to which the case 12 is bonded, a second substrate 50 is bonded, and the image pickup device 25 is mounted on the second substrate 50. The second substrate 50 is also formed in a rectangular planar shape, which is almost the same as the planar shape of the case 12.

Figure 2A:
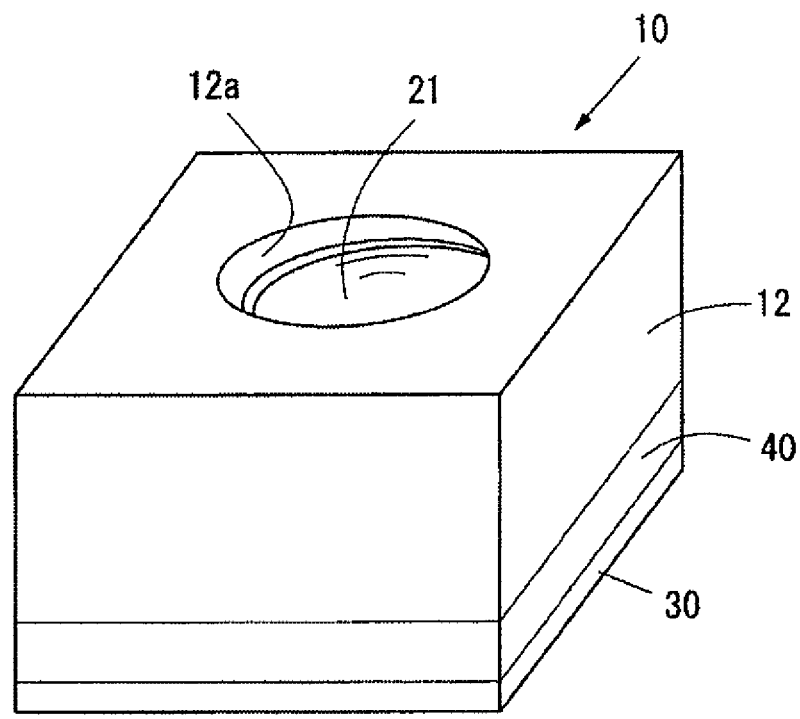
FIG. 2 is a perspective view of the camera module shown in FIG. 1.
Figure 2B:
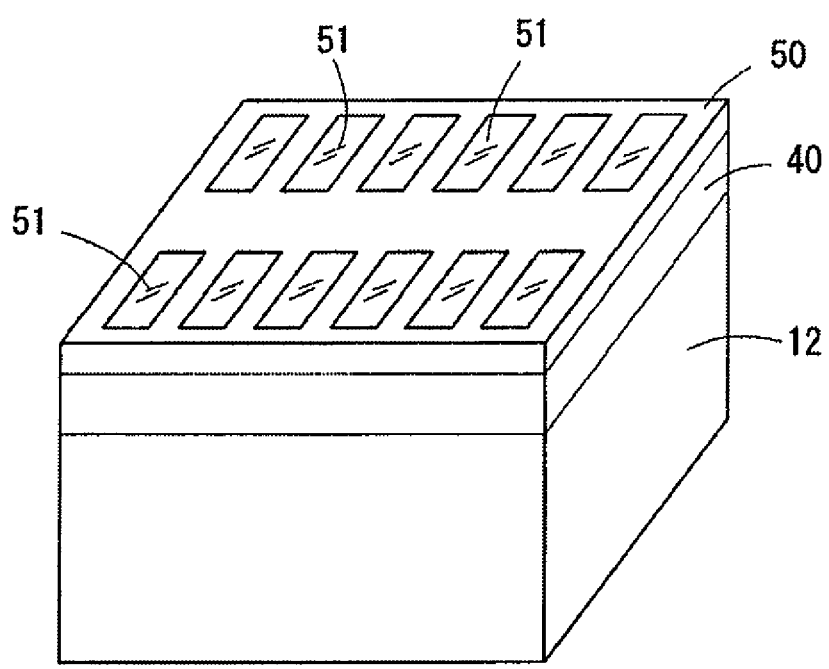

FIGS. 2A and 2B are external views illustrating a state in which the camera module 10 is assembled by bonding the case 12, the first substrate 40, and the second substrate 50. FIG. 2A shows an external view of the camera module 10 when viewed from the side (light-incidence side) on which the opening 12a is provided. Meanwhile, FIG. 2B shows an external view of the camera module 10 when viewed from the back surface side (the side on which the camera module 10 is mounted) of the second substrate 50.

The entire shape of the camera module 10 is almost a parallelepiped shape, and the inside of the camera module 10 is sealed from the external environment.

The lenses 21 of the lens unit 20 are disposed to face the opening 12a of the case 12 of the camera module 10.

Electrodes 51 are formed on the back surface of the second substrate 50, and mounted on a mounting surface of the mounting substrate on which the camera module 10 is mounted. Gold plating is applied as protective plating to the surfaces of the electrodes 51. When the camera module 10 is mounted on the mounting substrate, positions of the electrodes 51 and connection pads provided on the mounting substrate are aligned to each other, and the camera module 10 is mounted on the mounting substrate by soldering, for example.

In FIG. 1, an opening 40a is formed through the first substrate 40, and has a circular shape whose center coincides with the optical axis of the lens 21 in plan view. A step 40b for positioning and mounting the filter 30 is formed at the periphery of the opening 40a. The filter 30 is airtightly mounted on the first substrate 40 by positioning the periphery thereof to the step 40b.

The circuit components 43 and 44 may be a chip capacitor and an IC chip. The circuit components 43 and 44 are mounted on the front surface of the first substrate 40 in the outside of the region, on which the filter 30 is disposed. The circuit components 43 and 44 are bonded to the connection pads formed on the surface of the first substrate 40, through a conductive material such as a solder or a conductive adhesive. The types, the arrangement positions, and the number of the circuit components 43 and 44 depend on the types of products.

The image pickup device 25 is disposed on a front surface of the second substrate 50 to face the filter 30. Pads 53 for bonding wires are formed on the front surface of the second substrate 50 around the image pickup device 25, and the image pickup device 25 and the pads 53 are electrically connected through bonding wires 54.

The first substrate 40 functions as a spacer for supporting and separating the image pickup device 25 and bonding wire 54 so as to prevent the first substrate 40 and the filter 30 from blocking them. In the exemplary embodiments, a concave portion 40c with a certain depth where the image pickup device 25 can be housed is formed in the back surface of the first substrate 40. The concave portions 40c depend on the position of the image pickup device 25 arranged in plan view. Thus, when the second substrate 50 is bonded to the first substrate 40, it is possible to prevent the image pickup device 25 and the bonding wire 54 from being blocked by the filter 30 and the first substrate 40. A support 40d for supporting the filter 30 of the first substrate 40 is projected toward the periphery of the image pickup device 25.

Figure 3A:
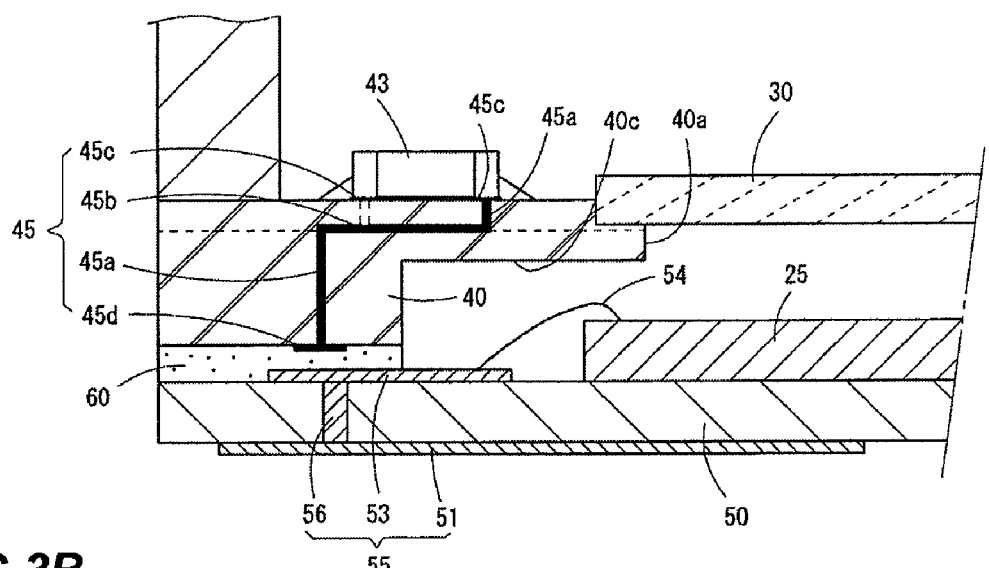
FIGS. 3A and 3B are sectional views illustrating a bonding portion of a first substrate and a second substrate in an enlarged manner.
Figure 3B:
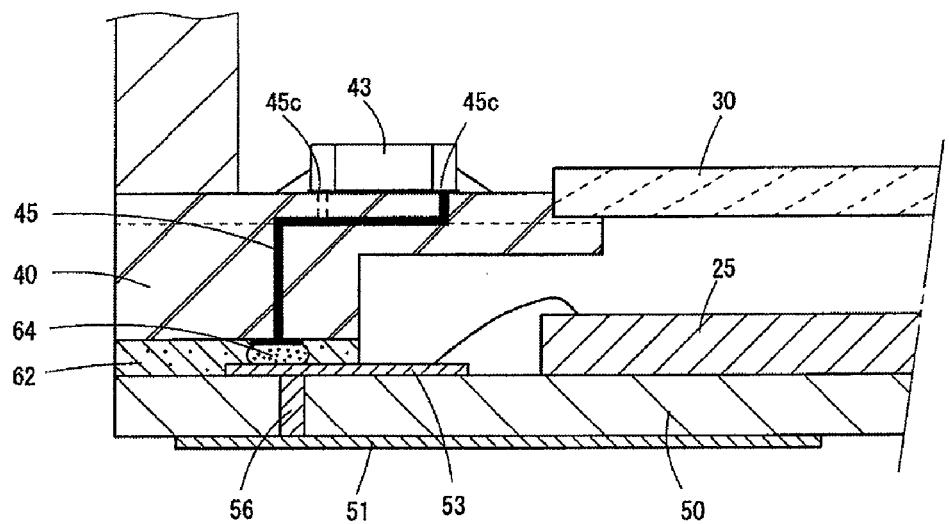

FIGS. 3A and 3B show enlarged views of the connection portion between the first substrate 40 and the second substrate 50. Also, FIGS. 3A and 3B show enlarged views of mounting portion of the circuit component 43. In mounting portion of the circuit component 44, the connection structure of the first substrate 40 and the second substrate 50 is almost the same.

The pads 53 are formed on the front surface of the second substrate 50, and the pads 53 and the electrodes 51 are electrically connected to each other through vias 56. The vias 56 are provided to penetrate the second substrate 50 in a thickness direction. The pads 53, the vias 56, and the electrodes 51 constitute second wires 55 of the second substrate 50.

When ceramic is used as a base material of the second substrate 50, a metallization pattern is formed on a surface of a ceramic green sheet in accordance with predetermined arrangement of the electrodes 51 and pads 53, through holes for the vias 56 are formed on the ceramic green sheet in accordance with planar arrangement of the vias 56. Then, the through holes are filled with a metal, and subsequently the entire ceramic green sheet is burned, thereby obtaining the second substrate 50.

When a resin substrate such as a glass epoxy substrate is used in the second substrate 50, the through holes are formed on a substrate wherein copper foil is laminated on both surfaces thereof, in accordance with the positions of the vias 56. Then, the through hole is filled with a conductive material using an electrolytic plating method, thereby forming the vias 56. In addition, the electrodes 51 and the pads 53 are formed by etching the copper foils of both surfaces of the substrate in a predetermined pattern. Thus, it is possible to form the second substrate 50.

First wires 45 formed on the first substrate 40 includes: via 45a formed as inner wires; wires 45b; connection pads 45c formed on a region on which the circuit component 43 is mounted; and pads 45d formed on the bonding surface of the second substrate 50.

The connection pads 45c are formed in accordance with the positions of the electrodes of the circuit components such as a chip capacitor and an IC chip mounted on the first substrate 40. The pads 45d are formed to face the pads 53 which are formed on the second substrate 50.

When ceramic is used as a base material of the first substrate 40, metallization patterns are formed as the connection pads 45c and the pads 45d on the surface of the ceramic green sheet, the through holes are provided to penetrate the ceramic green sheet in the thickness direction, and the through holes are filled with a metal. Thus, metallization patterns are formed in accordance with the patterns of the wires 45b on the ceramic green sheet.

On the first substrate 40, the concave portion 40c is formed so as to prevent the image pickup device 25 from blocking the filter 30 and the first substrate 40, and the opening 40a is formed to transmit light. Accordingly, when the first substrate 40 is formed, a green sheet having an opening corresponding to the opening 40a and the other green sheet having an opening corresponding to the concave portion 40c is laminated, thereby forming the concave portion 40c and the opening 40a. The wires 45b may be formed such that the green sheet having the wires 45b thereon and the above-mentioned green sheet are laminated and aligned with each other, and then the entire green sheets is burned.

When a resin substrate such as a glass epoxy substrate is used as a base material of the first substrate 40, the opening 40a and the concave portion 40c are formed by performing router processing on the resin substrate, and then the through holes are provided to penetrate the substrate in the thickness direction. Then, the through holes are filled with a conductive material using an electrolytic plating method, thereby forming the vias 45a, which interconnects the wires 45b, the connection pads 45c, the wires 45b, and the connection pads 45c. The vias 45a may be formed using a wiring substrate manufacturing method for forming multi-layered wire patterns on the resin substrate.

Furthermore, the process of forming the opening 40a and the concave portion 40c on the resin substrate may be performed after forming the vias 45a, the wires 45b, the connection pads 45c, and the pads 45d.

When the first substrate 40 and the second substrate 50 are made of ceramic, the ceramic generates little dust, and thus it is possible to suppress dust generated from the first substrate 40 and the second substrate 50. Thus, it is possible to secure reliability of the camera module.

On the other hand, when the first substrate 40 and the second substrate 50 are formed as resin substrates, dust may be generated from the processed surfaces of the substrates because a router processing is performed on the resin substrate. In addition, dust tends to be generated because of material properties of the resin substrate. Accordingly, it may be possible to prevent dust generation by coating a protective film (a resin film) for suppressing generation of dust on the sectional surface such as a cutting surface or the surface of the substrate.

FIG. 3A is an example of a method of electrically connecting the wires formed on the first substrate 40 and the second substrate 50, in which the camera module is assembled by closely bonding the first substrate 40 and the second substrate 50 to each other through an anisotropic conductive material 60. Since the anisotropic conductive material 60 is interposed between the bonding surfaces of the first substrate 40 and the second substrate 50, the pads 45d provided on the first substrate 40 are electrically connected to the pads 53 provided on the second substrate 50.

Thus, the first wires 45 provided on the first substrate 40 and the second wires 55 provided on the second substrate 50 are electrically connected to each other. As the anisotropic conductive material 60, an anisotropic conductive film or an anisotropic conductive paste may be used.

FIG. 3B is an example in which the first substrate 40 and the second substrate 50 are closely bonded to each other by an insulation material 62. In the exemplary embodiment, through a conductive material 64 such as a solder, the pads 45d of the first substrate 40 and the pads 53 of the second substrate 50 are bonded to each other, and thus the first wires 45 and the second wires 55 are electrically connected to each other. Then, the space between the bonding surfaces of the first substrate 40 and the second substrate 50 is filled with the insulation material 62, and the second substrate 50 and the first substrate 40 are sealed by the insulation material 62. An insulation paste may be used as the insulation material 62.

Thus, as shown in FIG. 1, the image pickup device 25 is housed in the space between the first substrate 40 and the second substrate 50 to be hermetically sealed from the external environment, and the image pickup device 25 and the electrodes 51 are electrically connected to each other. Accordingly, it is possible to obtain the camera module 10 in which the first wires 45 and the second wires 55 provided on the first substrate 40 and the second substrate 50 are electrically connected to each other.

In the camera module 10 shown in FIG. 1, the filter 30 is configured to cut an infrared-ray component from light which is collected by the lens unit 20, and an image is recognized by the image pickup device 25.

(Method of Assembling Camera Module)

FIGS. 4A to 7C show methods of assembling the camera module 10.

Figure 4A:
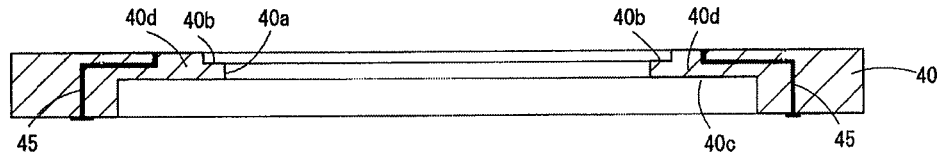
FIGS. 4A to 4C are sectional views illustrating a process of mounting a filter and circuit components on the first substrate.

FIG. 4 shows a process of mounting the filter 30 and the circuit components 43 and 44 on the first substrate 40. FIG. 4A is a sectional view of the first substrate 40. The opening 40a and the step 40b formed on the periphery of the opening 40a are formed on the front surface of the first substrate 40, and the concave portion 40c is formed on the back surface of the first substrate 40 which is to face the image pickup device 25. The first wires 45 including inner wires are formed on the first substrate 40.

Figure 4B:
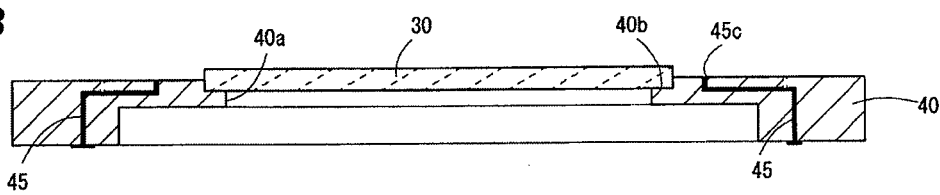
Figure 4C:
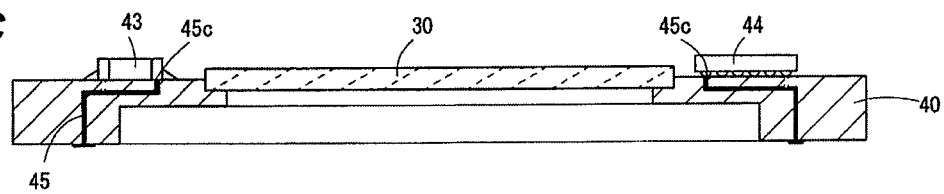

FIG. 4B shows a state in which the filter 30 is adhered closely to the support 40d in accordance with the position of the step 40b. FIG. 4C shows a state in which the circuit components 43 and 44 are mounted on the front surface of the first surface 40 to which the filter 30 is attached. The circuit components 43 and 44 are bonded to and mounted on the connection pads 45c, which are formed on the front surface of the first substrate 40, through a conductive material such as a solder.

Figure 5A:
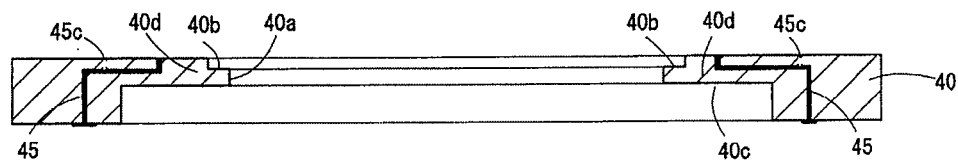
FIGS. 5A to 5C are sectional views illustrating another process of mounting the filter and the circuit components on the first substrate.
Figure 5B:
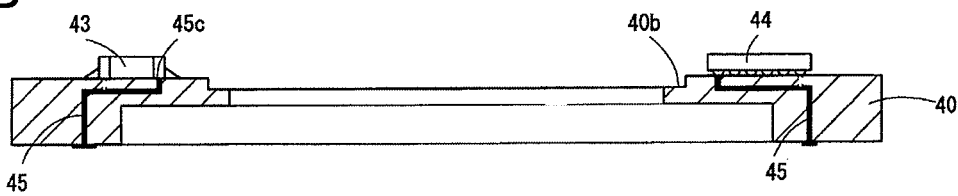
Figure 5C:
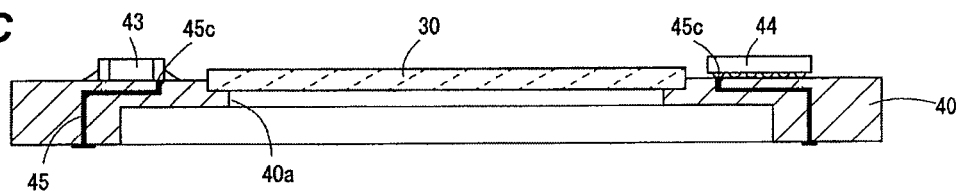

FIGS. 5A to 5C show another process of mounting the filter 30 and the circuit components 43 and 44 on the first substrate 40. That is, in the process shown in FIGS. 4A to 4C, the circuit components 43 and 44 are mounted on the first substrate 40 after the filter 30 is mounted on the first substrate 40. In the meanwhile, in the manufacturing process shown in FIGS. 5A to 5C, the circuit components 43 and 44 are mounted on the first substrate 40 before the filter 30 is mounted on the first substrate 40.

FIG. 5A shows a first substrate 40 on which the circuit components 43 and 44 are not mounted. FIG. 5B shows a state in which the circuit components 43 and 44 are mounted on the first substrate 40. FIG. 5C shows a state in which the filter 30 is mounted on the first substrate 40.

According to the manufacturing process shown in FIGS. 5A to 5C, the process of mounting the filter 30 on the first substrate 40 is performed after the process of mounting the circuit components 43 and 44. Thus, it is possible to prevent dirt from being attached on the surface of the filter 30. In the process of mounting the circuit components 43 and 44 on the first substrate 40, it is necessary to undergo processes such as a component mounting process, a reflow process, and a flux cleaning process. When the first substrate 40 mounted with the filter 30 undergoes these processes, dirt tends to be attached on the filter 30. In the manufacturing process shown in FIGS. 5A to 5C, by performing the process of mounting the filter 30 after the process of mounting the circuit components 43 and 44, it is possible to prevent dirt from being attached on the filter 30.

Furthermore, some products have a camera module structure in which a filter is mounted on one surface of the substrate and the image pickup device is mounted on the other surface thereof. In this case, any one of the filter and the image pickup device is mounted on the substrate, and then the other component is mounted on the substrate. Thus, when the component is mounted in the subsequent process, dirt is likely to be attached on the component already mounted on the substrate. Similarly to the camera module according to the exemplary embodiment, when the substrate (first substrate 40) mounted with the filter 30 and the substrate (second substrate 50) mounted with the image pickup device 25 are assembled independently from each other, it is possible to perform assembly without dirt attaching to the filter 30 or the image pickup device 25 which are sensitive to dirt.

Figure 6A:
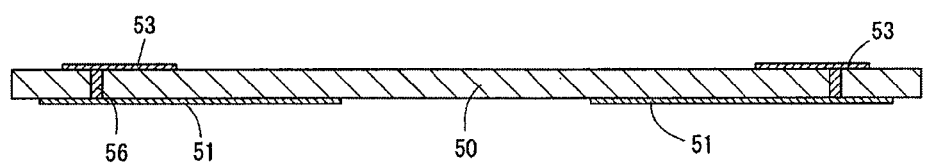
FIGS. 6A to 6C are sectional views illustrating a process of mounting an image pickup device on the second substrate.
Figure 6B:
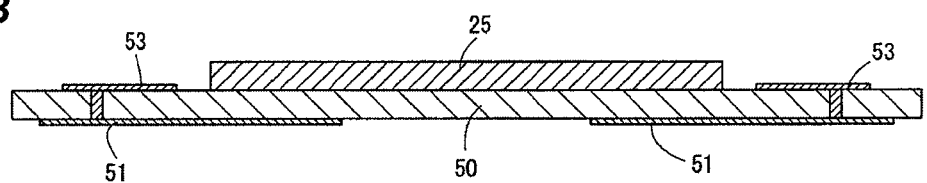
Figure 6C:
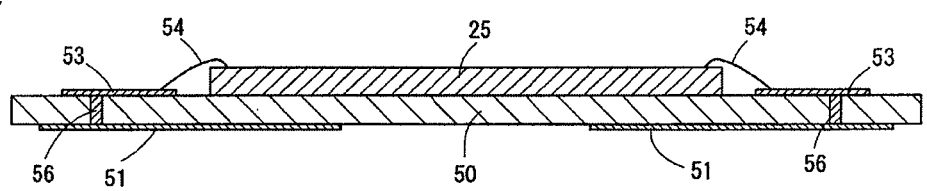

FIGS. 6A to 6C show a process of mounting the image pickup device 25 on the second substrate 50. FIG. 6A is a sectional view of the second substrate 50. The front surface of the second substrate 50 is formed as a mounting surface of the image pickup device 25, the pads 53 are formed on the front surface of the second substrate 50, and the electrodes 51 are formed on the back surface (the mounting surface) of the second substrate 50. The pads 53 and the electrodes 51 are electrically connected to each other through the vias 56. FIG. 6B shows a state in which the image pickup device 25 is bonded to the front surface of the second substrate 50. The image pickup device 25 is bonded to a predetermined position of the second substrate 50 by an adhesive. FIG. 6C shows a state in which the image pickup device 25 and the pads 53 are bonded to each other by bonding wire.

Figure 7A:
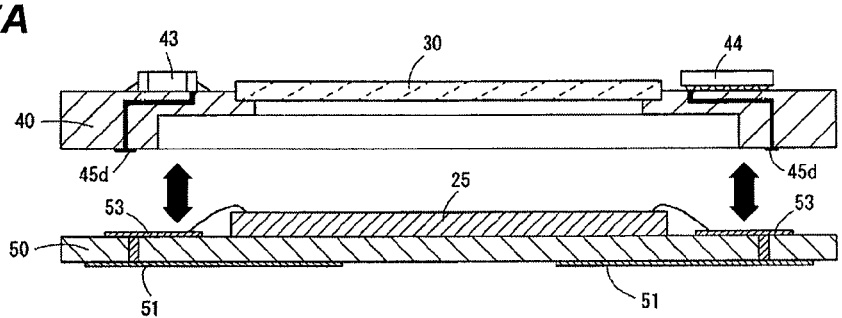
FIGS. 7A to 7C are sectional views illustrating a process of assembling the camera module.
Figure 7B:
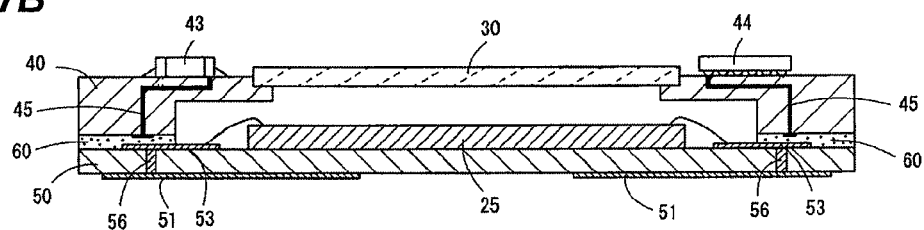

FIGS. 7A and 7B show a process of bonding the first substrate 40, on which the filter 30 and the circuit components 43 and 44 are mounted, to the second substrate 50 on which the image pickup device 25 is mounted. When the first substrate 40 and the second substrate 50 are bonded to each other by the anisotropic conductive material 60, the anisotropic conductive material 60 is filled between the bonding surfaces of the first substrate 40 and the second substrate 50 and then is heat and pressurized in the thickness direction, thereby boding the substrates.

With the anisotropic conductive material 60, the electrical connection is secured only in the portions in which the pads 45d face the pads 53.

FIG. 7B is an example of bonding the first substrate 40 to the second substrate 50 using the anisotropic conductive material 60.

When the first substrate 40 and the second substrate 50 are bonded using the insulation material 62, the pads 45d of the first substrate 40 and the pads 53 of the second substrate 50 are bonded to each other using a conductive material such as a solder, and then the space between the bonding surfaces of the first substrate 40 and the second substrate 50 is filled with the insulation material 62, and the insulation material 62 is thermally cured, thereby bonding them integrally.

By bonding the first substrate 40 to the second substrate 50, the image pickup device 25 is hermetically sealed in the space formed between the first substrate 40 and the second substrate 50. The process of bonding the first substrate 40 and the second substrate 50 is performed in a clean room so that dust is not sealed in the space, in which the image pickup device 25 is mounted and which is sealed by the first substrate 40 and the second substrate 50. The problem of dust attaching to the light receiving surface of the image pickup device 25 directly causes defect of product. In order to avoid the problem of dust attaching to the image pickup device 25 after assembly as much as possible, the image pickup device 25 is sealed under the environment in which dust is not attached to the image pickup device 25, and the base material which is unlikely to generate dust is used as the first substrate 40 and the second substrate 50.

Figure 7C:
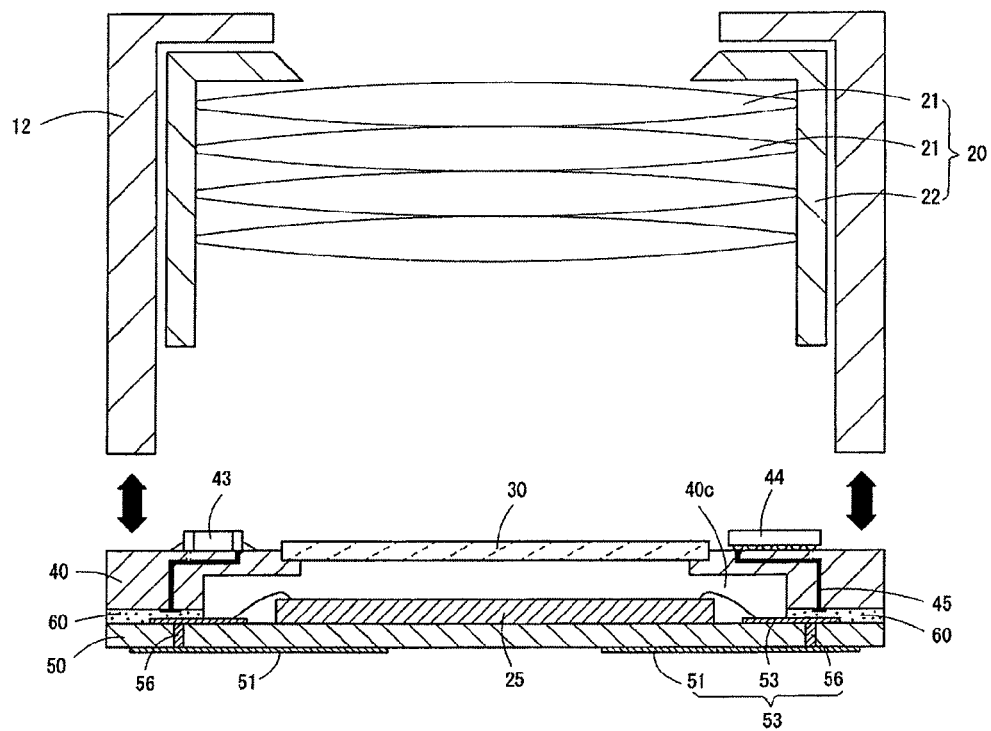

Thereafter, the case 12 having the lens unit 20 is bonded to the bonding bodies consisting of the first substrate 40 and the second substrate 50 (see FIG. 7C). By positioning and bonding the end surface of the case 12 to the bonding bodies consisting of the first substrate 40 and the second substrate 50, the opening of the lower part (the other side) of the case 12 is completely sealed. The first substrate 40 and the second substrate 50 are formed in a shape which is the same as the shape (planar shape) of the end surface of the case 12. Thus, by bonding the first substrate 40 and the second substrate 50 to the case 12, the camera module 10 is formed in a parallelepiped shape as shown in FIGS. 2A and 2B.

Furthermore, a material generating little dust is used as the case 12 and the lens unit 20. Dust of the second substrate 50 and the first substrate 40 has a direct effect on the image pickup device 25, while dust of the case 12 and the lens unit 20 has an indirect effect thereon. Thus, as compared with the first substrate 40 and the second substrate 50, the condition of suppressing dust generated from the case 12 and the lens unit 20 is relaxed.

The camera module 10 according to the exemplary embodiment is based on a structure in which electrodes 51 are arranged in the planar area of the mounting surface of the camera module 10 as shown in FIG. 2B. Accordingly, in the mounting substrate, the planar area (mounting area) of the camera module 10 has only to be secured.

As described above, when the electrodes 51 are arranged in the area of the mounting surface (the lower surface) of the camera module 10, the camera module 10 has a structure in which the image pickup device 25 is mounted on the second substrate 50, that is, inside the camera module 10. With such a structure, when the total height of the camera module 10 is set to be constant, the thickness of the second substrate 50 defines the separation distance between the lens 21 and the image pickup device 25. Thus, by decreasing the thickness of the second substrate 50 as much as possible, it is possible to increase the separation distance between the lens 21 and the image pickup device 25.

The camera module 10 according to the embodiment of the invention has a structure in which the circuit components 43 and 44 such as a chip capacitor are supported on the first substrate 40 that supports the filter 30 and the second substrate 50 has only the image pickup device 25 mounted thereon. Accordingly, in the second substrate 50, only the second wires 55 which are electrically connected to the image pickup device 25 may be formed, and it is possible to easily decrease the thickness of the second substrate 50 by simplifying the wiring structure. Thus, when the total height of the camera module 10 is defined, it is possible to increase the space between the lens 21 and the image pickup device 25 effectively. As a result, it is possible to increase quality of the camera module 10.

Further, since the circuit components 43 and 44 are mounted on the first substrate 40 in the peripheral area of the filter 30, it is possible to mount the circuit components 43 and 44 without blocking the mounting area of the filter 30 and the mounting area of the image pickup device 25. As a result, it is possible to secure a degree of freedom in arrangement of the circuit components 43 and 44. Further, the circuit components 43 and 44 can be arranged, in plan view, so as to overlap with the mounting area of the image pickup device 25 mounted on the second substrate 50. Thereby, it is possible to decrease the size of the camera module 10.

Furthermore, in the exemplary embodiment, the second substrate 50 on which the image pickup device 25 is mounted is formed as a planar plate body, and the opening 40*a* and the concave portion 40*c* are formed in the first substrate 40. However, the first substrate 40 and the second substrate 50 may have different structures. For example, it may be possible to adopt a structure in which the first substrate 40 is formed by a planar plate body, a concave portion for housing the image pickup device 25 is provided in the second substrate 50, the first substrate 40 and the second substrate 50 are bonded to each other, and the image pickup device 25 is disposed in the bonding bodies consisting of the second substrate 50 and the first substrate 40. In this case, it is advantageous that the separation space between the lens 21 and the image pickup device 25 be set to be large by decreasing as much as possible the thickness of the second substrate 50 in the area in which the image pickup device 25 is mounted. Similarly to the embodiment, the circuit components are mounted on the first substrate 40.

Further, in the exemplary embodiment, the case 12 is formed in a parallelepiped shape, but the shape of the case 12 is not limited to the parallelepiped shape. For example, the case 12 may be formed in a tubular shape whose planar shape is a circular shape or a tubular shape whose planar shape is a polygon shape such as a hexagon shape.

Further, in the exemplary embodiment, the outer shapes of the first substrate 40 and the second substrate 50 are made to coincide with the planar shape of the case 12. However, it is apparent that it is possible to make circumferences of the first substrate 40 and the second substrate 50 slightly larger than that of the planar shape of the case 12.

Further, it is possible to set appropriately dimensions such as height and width of the camera module 10 depending on the types of products.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A camera module comprising:
   a case comprising:
      a first surface formed with a first opening for entering incident light; and
      a second surface opposite to the first surface, the second surface being formed with a second opening,
   a lens unit comprising a plurality of lenses and being mounted in the case;
   a first substrate comprising a front surface and a back surface opposite to the front surface, the first substrate comprising a first wiring, wherein the case is bonded to the front surface of the first substrate to seal the second opening of the case,
   a filter supported by the first substrate to face the lens unit;
   a circuit component disposed on the front surface of the first substrate to be electrically connected to the first wiring;
   a second substrate comprising a front face and a back face opposite to the front face, the second substrate comprising a second wiring, wherein the front face of the second substrate is bonded to the back surface of the first substrate such that the second wiring is electrically connected to the first wiring; and
   an image pickup device disposed on the front face of the second substrate to face the filter, the image pickup device being electrically connected to the second wiring,
   wherein the first wiring comprises:
      a first front pad on the front surface of the first substrate;
      a first back pad on the back surface of the first substrate; and
      a first connecting portion formed in the first substrate to electrically connect the first front pad and the first back pad,
   wherein the second wiring comprises:
      a second front pad on the front face of the second substrate;
      a second back pad on the back face of the second substrate; and
      a second connecting portion formed in the second substrate to electrically connect the second front pad and the second back pad.

2. The camera module according to claim 1, wherein the second substrate is bonded to the first substrate via an anisotropic conductive material such that the first back pad is electrically connected to the second front pad.

3. The camera module according to claim 1, wherein the second substrate is bonded to the first substrate via an insulating material while the first back pad is electrically connected to the second front pad via a conductive material.

4. The camera module according to claim 1, wherein the front surface of the first substrate is formed with an opening, and the filter is supported by the first substrate to seal the opening of the front surface, and
wherein the back surface of the first substrate is formed with a concave portion, and the image pickup device is disposed on the front face of the second substrate to be housed in the concave portion of the back surface, and
wherein the second substrate is a planar plate body.

5. The camera module according to claim 1, wherein when viewed from the top, a shape of first substrate and a shape of the second substrate are the same as that of the case.

6. The camera module according to claim 1, wherein the first substrate and the second substrate are made of ceramic.

* * * * *